(12) United States Patent
Oda

(10) Patent No.: US 7,476,328 B2
(45) Date of Patent: Jan. 13, 2009

(54) METHOD OF MANUFACTURING PRINTED CIRCUIT BOARD

(75) Inventor: Takashi Oda, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 203 days.

(21) Appl. No.: 11/317,596

(22) Filed: Dec. 23, 2005

(65) Prior Publication Data
US 2006/0157351 A1    Jul. 20, 2006

(30) Foreign Application Priority Data
Jan. 14, 2005   (JP) .............................. 2005-007920

(51) Int. Cl.
*H01B 13/00* (2006.01)
(52) U.S. Cl. .............................. 216/13; 216/16; 216/18; 216/20; 216/71; 216/81
(58) Field of Classification Search .................. 216/16, 216/18, 20, 71, 81, 13
See application file for complete search history.

(56) References Cited

U.S. PATENT DOCUMENTS

| | | | |
|---|---|---|---|
| 4,740,700 A * | 4/1988 | Shaham et al. .............. | 250/332 |
| 5,421,934 A * | 6/1995 | Misaka et al. ................. | 216/59 |
| 6,515,233 B1 * | 2/2003 | Labzentis et al. ........... | 174/254 |
| 2001/0003678 A1 * | 6/2001 | Stinnett et al. .............. | 438/723 |
| 2002/0162218 A1 * | 11/2002 | Skorupski et al. ............. | 29/847 |

FOREIGN PATENT DOCUMENTS

| | | |
|---|---|---|
| JP | 2004-249774 A | 9/2004 |
| JP | 2004-259774 A | 9/2004 |

OTHER PUBLICATIONS

Wolf, Stanley et al. "Silicon Processing For The VLSI Era", vol. 1: Process Technology, 1986; pp. 544-545.*

* cited by examiner

*Primary Examiner*—Binh X Tran
(74) *Attorney, Agent, or Firm*—Panitch Schwarze Belisario & Nadel LLP

(57) ABSTRACT

A printed circuit board having prescribed conductive patterns formed on an insulating layer is provided about 20 mm apart from an AC electrode provided in a plasma etching device. An earth electrode is provided on the side opposing the AC electrode. More specifically, the printed circuit board is provided outside a sheath layer that is a region having a high plasma density generated in the vicinity of the AC electrode. The frequency of an AC power supply is preferably not more than 1 GHz. The pressure in the device is preferably in the range from $1.33 \times 10^{-2}$ Pa to $1.33 \times 10^{2}$ Pa. The inter-electrode distance between the AC electrode and the earth electrode is preferably not more than 150 mm, more preferably from 40 mm to 100 mm.

5 Claims, 6 Drawing Sheets

METHOD OF MANUFACTURING PRINTED CIRCUIT BOARD

BACKGROUND OF THE INVENTION

1. Field of the Invention

The present invention relates to a method of manufacturing a printed circuit board.

2. Description of the Background Art

Printed circuit boards are generally produced by the semi-additive method. The semi-additive method includes the steps of forming a thin metal film on an insulating layer by sputtering, forming plating resist in a prescribed pattern on the thin metal film, forming conductive patterns in a region without the plating resist, removing the plating resist, and removing the exposed thin metal film by etching.

In this case, after the exposed thin metal film is removed by etching according to the semi-additive method, a small amount of the residue of the metal film (hereinafter referred to as "residual metal") may be left on the insulating layer.

FIG. 5 shows schematic views of residual metal present on the insulating layer. As shown in FIG. 5(a), prescribed conductive patterns 3 are formed on the insulating layer 1 with a thin metal film 2 interposed therebetween.

FIG. 5(b) is an enlarged view of the region A between the conductive patterns 3 on the insulating layer 1 in FIG. 5(a).

As shown in FIG. 5(b), a plurality of residual metal pieces 2a are present on the insulating layer 1 between the conductive patterns 3.

When the printed circuit board is used in a high temperature and high humidity environment, a short-circuit may be caused between the conductive patterns in some cases because of ion migration. The residual metal can accelerate the occurrence of ion migration.

Therefore, methods of removing the residual metal by carrying out plasma etching have been proposed (see for example JP 2004-259774 A).

The disclosed conventional plasma etching is however anisotropic etching, and therefore the residual metal pieces 2a on the insulating layer 1 serve as masks against the plasma as shown in FIG. 6, and the region of the insulating layer 1 excluding the region under the residual metal pieces 2a is etched. As a result, the residual metal is not sufficiently removed. Note that in the anisotropic etching, etching is accelerated in the thickness-wise direction of the object.

SUMMARY OF THE INVENTION

It is an object of the invention to provide a method of manufacturing a printed circuit board that allows the residue of a thin metal film on an insulating layer to be sufficiently removed and ion migration to be prevented accordingly.

A method of manufacturing a printed circuit board according to an aspect of the invention includes the steps of forming a thin metal film on an insulating layer, forming conductive patterns on the thin metal film by electroplating, removing the thin metal film excluding a region under the conductive patterns by etching, and processing the insulating layer exposed between the conductive patterns by isotropic plasma etching.

According to the method of manufacturing a printed circuit board, a thin metal film is formed on an insulating layer and conductive patterns are formed on the thin metal film by electroplating. Then, the thin metal film is removed excluding the region under the conductive patterns by etching. The insulating layer exposed between the conductive patterns is processed by isotropic plasma etching.

In this way, plasma comes under the residual metal on the insulating layer, so that the insulating layer under the residual metal is etched. The residual metal can be removed together with the insulating layer under the residual metal. Consequently, ion migration can be prevented.

The processing step may include carrying out isotropic plasma etching to the insulating layer so that the etching depth of the insulating layer in the thickness-wise direction is in the range from 0.5 μm to 2 μm.

In this case, if the insulating layer is etched less than the above described range, the residual metal cannot sufficiently be removed, while if the insulating layer is etched more than the range, the strength of the insulating layer is lowered.

The processing step may include the step of providing the insulating layer outside a sheath layer in a plasma atmosphere. In this case, in the region outside the sheath layer, the electron density and the ion density in the plasma are substantially equal, so that the effect of etching with ions is small and the etching proceeds in two etching directions, i.e., perpendicular and parallel directions to the insulating layer. In this way, isotropic etching is enabled.

The step of forming a thin metal film on the insulating layer may include the step of forming a thin metal film including a layer of copper on the insulating layer. In this way, the insulating layer and the thin metal film can be more closely contacted with each other.

The insulating layer may include polyimide. In this case, good insulation can be provided.

According to the invention, the residual metal can sufficiently be removed together with the insulating layer under the residual metal. Consequently, ion migration can be prevented.

Other features, elements, characteristics, and advantages of the present invention will become more apparent from the following description of preferred embodiments of the present invention with reference to the attached drawings.

DESCRIPTION OF THE PREFERRED EMBODIMENTS

Now, a method of manufacturing a printed circuit board according to the invention will be described in conjunction with the accompanying drawings.

First Embodiment

As the method of manufacturing the printed circuit board, a general semi-additive method is employed.

Figure 1:
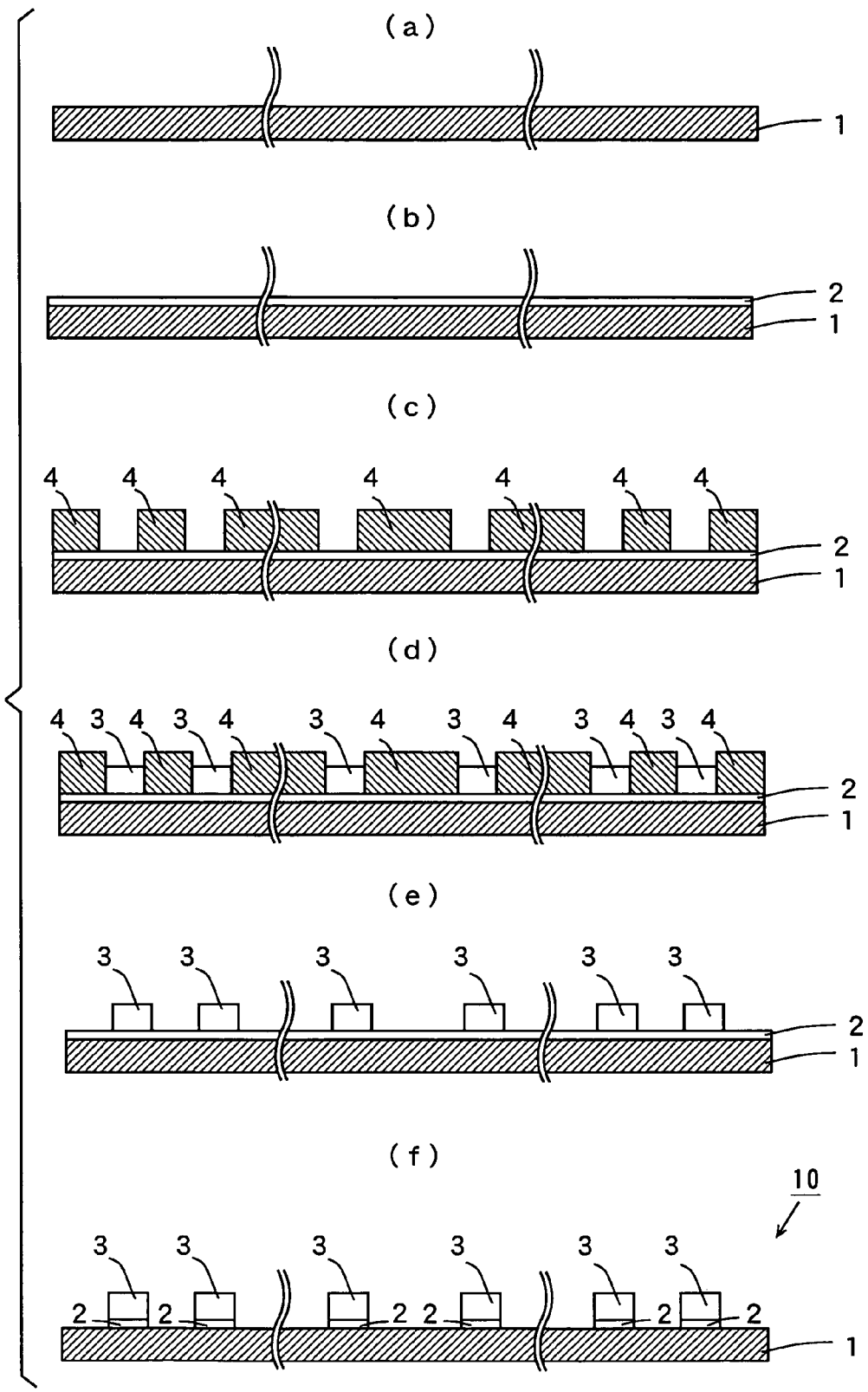
FIG. 1 is a schematic sectional view showing the steps in an example of a method of manufacturing a printed circuit board according to a semi-additive method.

FIG. 1 is a schematic sectional view showing the steps in an example of the method of manufacturing a printed circuit board according to the semi-additive method.

As shown in FIG. 1(a), an insulating layer 1 of a polyimide film having a thickness of for example 25 µm is prepared.

Then, as shown in FIG. 1(b), a thin metal film 2 is formed by sputtering or electroless plating on the insulating layer 1. Note that the thin metal film 2 has a layered structure including a layer of nickel (Ni)-chromium (Cr) having a thickness of for example 40 nm and a layer of copper (Cu) having a thickness of for example 100 nm.

Now, as shown in FIG. 1(c), using dry film resist or the like, plating resist 4 in patterns reversed from conductive patterns (that will be described in connection with subsequent steps) is formed on the thin metal film 2.

Then, as shown in FIG. 1(d), at the surface of the thin metal film 2 without the plating resist 4, the conductive patterns 3 having for example a thickness of 10 µm and a width of for example 40 µm are formed by electro-copper plating. Note that the interval between conductive patterns 3 is for example 40 µm.

Then, as shown in FIG. 1(e), the plating resist 4 is removed by peeling or the like.

Then, as shown in FIG. 1(f), the layer of copper in the thin metal film 2 is removed by chemical etching excluding the region under the conductive patterns 3. Note that an etching agent used for the chemical etching is a mixture liquid of hydrogen peroxide and sulfuric acid.

The layer of nickel-chromium in the thin metal film 2 is then removed by chemical etching excluding the region under the conductive patterns 3. Note that the etching agent used for the chemical etching is a mixture liquid of hydrochloric acid and sulfuric acid.

In this way, the printed circuit board 10 having the prescribed conductive patterns 3 on the insulating layer 1 is formed.

Plasma etching for removing residual metal remaining on the insulating layer 1 of the thus produced printed circuit board 10 will be described.

Note that according to this embodiment and each of the following embodiments, in the plasma etching carried out to the printed circuit board 10, the frequency of an AC power supply, the pressure in a device for the plasma etching, the interval between an earth electrode and an AC electrode (inter-electrode distance), and the position for providing the printed circuit board as a work piece are adjusted.

Figure 2:
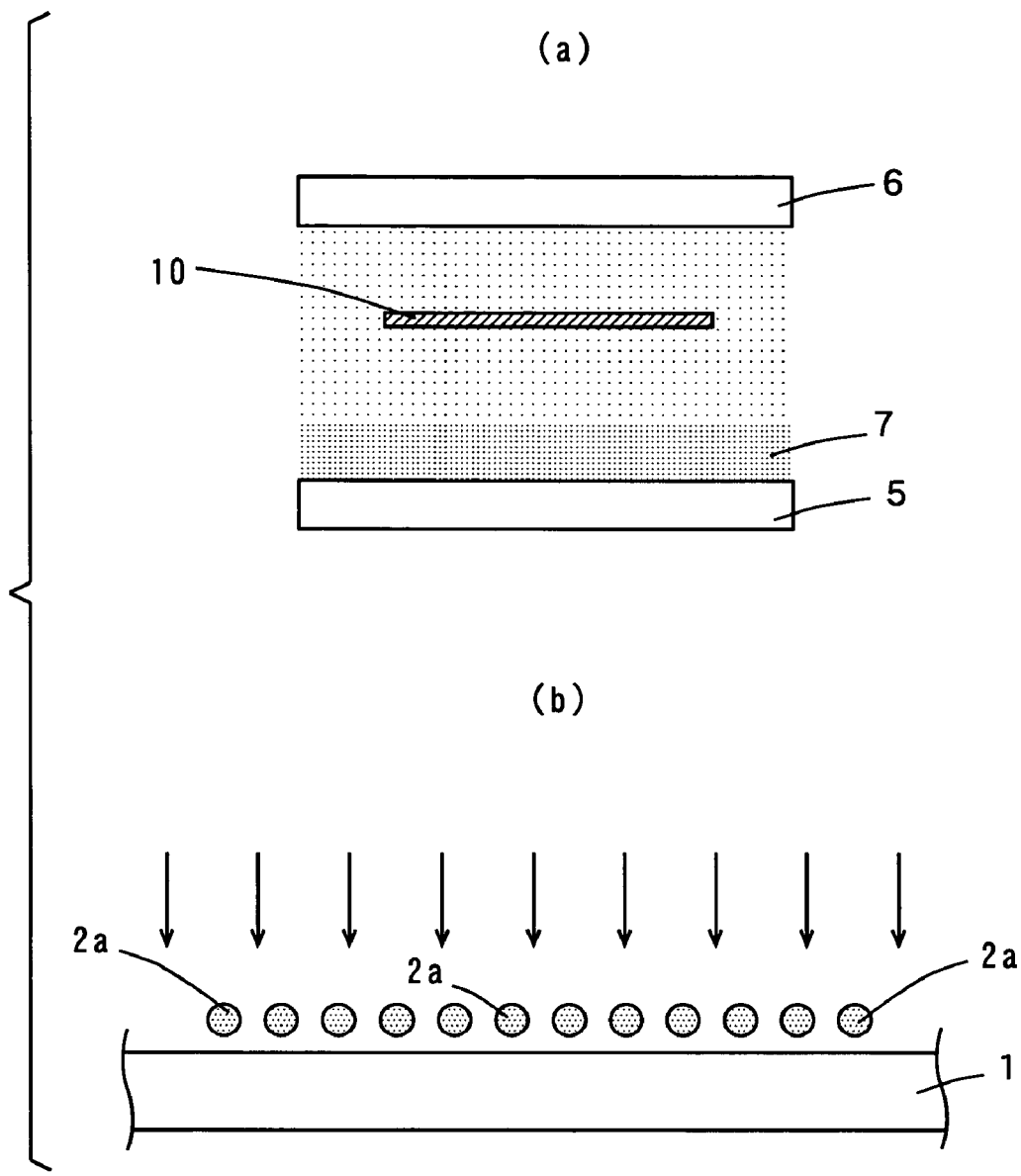
FIG. 2(a) is a schematic view of how a printed circuit board is processed by plasma etching.
FIG. 2(b) is a schematic view of how the printed circuit board is processed by etching.

FIG. 2(a) is a schematic view of how the printed circuit board 10 is processed by plasma etching, and FIG. 2(b) is a schematic view of how the printed circuit board 10 is processed by etching.

As shown in FIG. 2(a), the printed circuit board 10 is provided for example in a position about 20 mm apart from the AC electrode 5 provided inside the plasma etching device. Note that the earth electrode 6 is provided on the side opposing the AC electrode 5.

The frequency of the AC power supply is preferably not more than 1 GHz. The pressure in the device is preferably from $1.33 \times 10^{-2}$ Pa to $1.33 \times 10^{2}$ Pa. The processing power is preferably from 500 W to 2000 W. The processing time is preferably from 30 seconds to 3 minutes.

The inter-electrode distance between the AC electrode 5 and the earth electrode 6 is preferably not more than 150 mm, more preferably from 40 mm to 100 mm. In this way, plasma discharge is carried out in a stable manner.

The gas for the plasma etching may be an oxygen containing gas. In order to improve the efficiency of the etching process, a mixture gas of a fluorine-containing gas such as tetrafluorocarbon ($CF_4$) and trifluorocarbon ($CF_3$) and the oxygen-containing gas described above is preferably used.

As described above, according to the embodiment, the printed circuit board 10 is provided in the position about 20 mm apart from the AC electrode 5 that is provided in the plasma etching device. More specifically, as shown in FIG. 2(a), the printed circuit board 10 is provided outside a sheath layer 7 that is a region having a high plasma density generated in the vicinity of the AC electrode 5. Note that the sheath layer 7 is generated in a range of 10 mm apart from the AC electrode 5.

In this inventive example, in the sheath layer 7, the ion density is high as compared with the electron density in the plasma, so that the ions are accelerated in the direction of electric field. More specifically, the direction of the etching by the ions is perpendicular to the AC electrode 5, and the effect of etching in the direction parallel to the AC electrode 5 is reduced.

As described above, according to the embodiment, the printed circuit board 10 is provided in the region outside the sheath layer 7 (generally referred to as "bulk plasma region"). In the bulk plasma region, the electron density and the ion density are substantially equal, and therefore the region is less affected by the etching with the ions. In addiction, the etching with the ions proceeds in two directions, i.e., orthogonal and parallel directions to the AC electrode 5. In this way, isotropic etching is enabled.

As described above, the printed circuit board 10 is processed by isotropic etching, so that plasma comes under the residual metal 2a on the insulating layer 1 as shown in FIG. 2(b). Then, the insulating layer 1 under the residual metal 2a is etched. In this way, the residual metal 2a can be removed together with the insulating layer 1 located under the residual metal 2a. Consequently, ion migration can be prevented.

Second Embodiment

Figure 3:
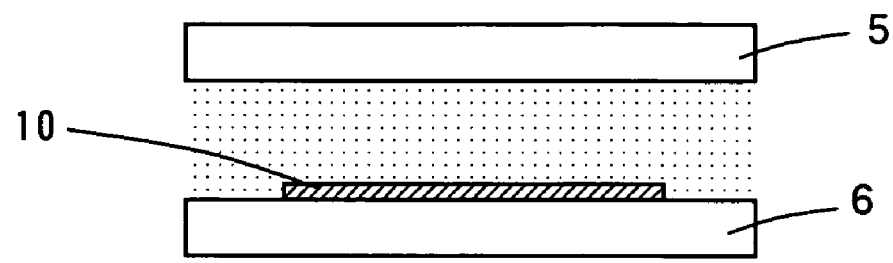
FIGS. 3 and 4 are schematic views of other examples of how the printed circuit board is processed by plasma etching.

FIG. 3 is a schematic view of another example of how the printed circuit board 10 is processed by plasma etching.

As shown in FIG. 3, the printed circuit board 10 is provided for example on the earth electrode 6 provided in the plasma etching device. Note that if the AC electrode 5 contacts the printed circuit board 10, the printed circuit board 10 is damaged, and therefore the distance between the printed circuit board 10 and the AC electrode 5 is preferably not less than 1 mm.

The frequency of the AC power supply is preferably not more than 1 GHz. The pressure in the device is preferably atmospheric pressure ($1.0 \times 10^5$ Pa). The processing power is preferably from 500 W to 2000 W. The processing time is preferably from 10 seconds to 2 minutes.

The inter-electrode distance between the AC electrode 5 and the earth electrode 6 is preferably not more than 10 mm, more preferably from 1 mm to 5 mm. In this way, plasma discharge is carried out in a stable manner.

The gas for the plasma etching is the same as that according to the first embodiment.

As described above, according to the embodiment, the inter-electrode distance between the AC electrode 5 and the earth electrode 6 is not more than 10 mm, and the air pressure in the device is the atmospheric pressure, so that the sheath layer 7 is not generated between the AC electrode 5 and the earth layer 6. This allows the printed circuit board 10 to be provided in any location between the AC electrode 5 and the earth electrode 6 other than on the earth electrode 6 in the described example.

According to the embodiment, similarly to the first embodiment described above, the printed circuit board 10 is provided in the region without the sheath layer 7. Consequently, isotropic etching is enabled.

As in the foregoing, the printed circuit board 10 is processed by isotropic etching, so that plasma comes under the residual metal 2a on the insulating layer 1. As a result, the insulating layer 1 under the residual metal 2a is etched. The residual metal 2a can be removed together with the insulating layer located under the residual metal 2a. Consequently, ion migration can be prevented.

Third Embodiment

Figure 4:
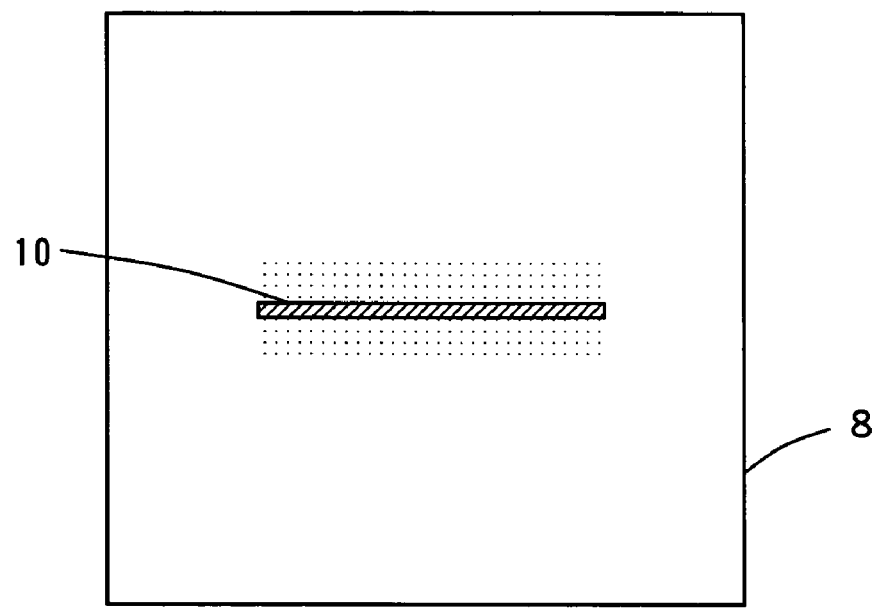
Figure 5:
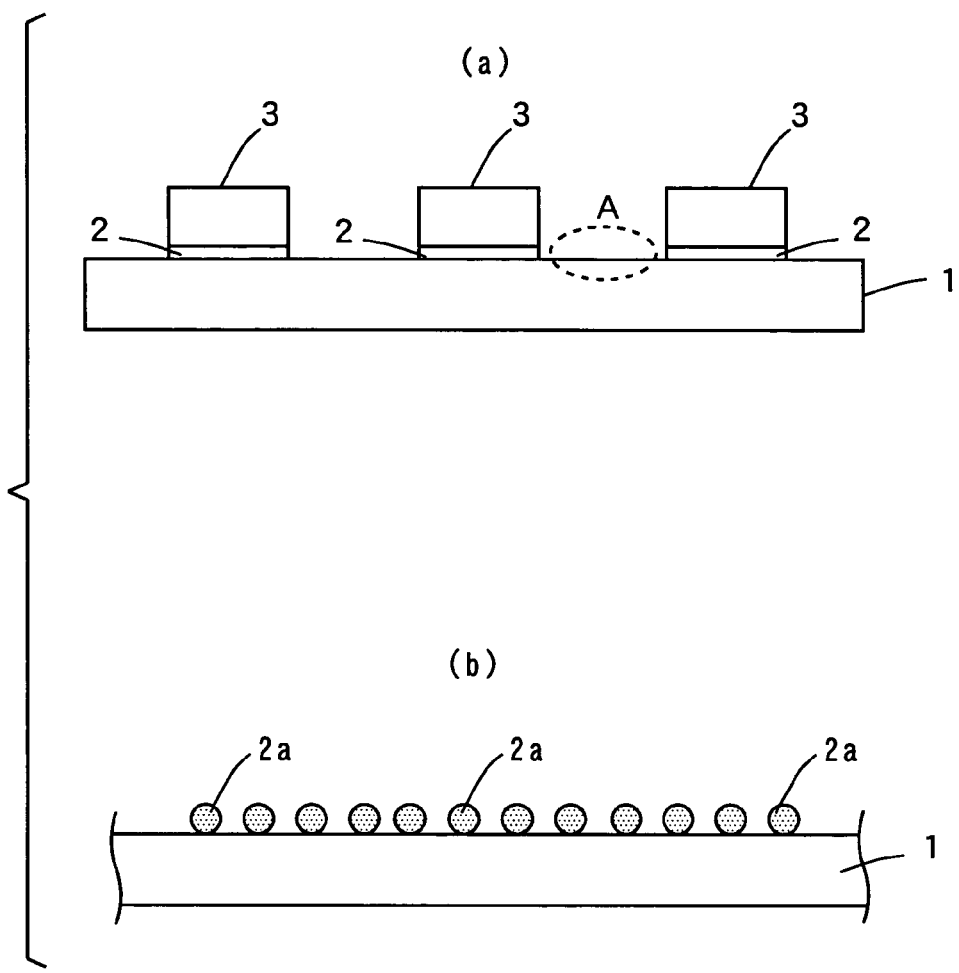
FIG. 5 is a schematic view of residual metal existing on an insulating layer.
Figure 6:
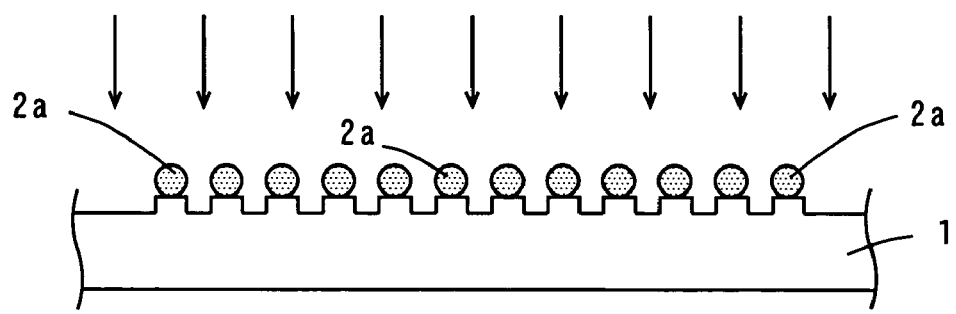
FIG. 6 is a view for use in illustrating how conventional plasma etching is carried out.

FIG. 4 is a schematic view of yet another example of how the printed circuit board 10 is processed by plasma etching.

As shown in FIG. 4, the printed circuit board 10 is provided for example in a chamber 8 in a magnetron type plasma etching device. Note that in FIG. 4, the printed circuit board 10 is placed about in the center of the chamber 8, but it may be placed in any position inside the chamber 8.

The frequency of the AC power supply is preferably not less than 1 GHz. The pressure in the chamber 8 is preferably from $1.33 \times 10^{-2}$ Pa to $1.33 \times 10^{2}$ Pa. The processing power is preferably from 400 W to 1000 W. The processing time is preferably from 20 seconds to 2 minutes.

The gas for the plasma etching is the same as that of the first embodiment.

According to the embodiment, plasma etching is carried out in the chamber 8 in the magnetron type plasma etching device, so that the sheath layer 7 does not form. In this way, isotropic etching is enabled.

As described above, the printed circuit board 10 is processed by the isotropic etching, so that plasma comes under the residual metal 2a on the insulating layer 1. As a result, the insulating layer 1 under the residual metal 2a is etched. Consequently, the residual metal 2a can be removed together with the insulating layer 1 located on the residual metal 2a. Accordingly, ion migration can be prevented.

Note that according to the embodiment, the insulating layer 1 is etched by a thickness in the range from 0.5 μm to 2.0 μm. If the layer is etched less than the range, the residual metal 2a cannot sufficiently be removed, while if the layer is etched more than the range, the strength of the insulating layer 1 is lowered.

EXAMPLES

Now, inventive examples of the invention will be described.

Inventive Example 1

When the surface of the insulating layer 1 between the conductive patterns 3 in the printed circuit board 10 manufactured according to the first embodiment was analyzed using a wavelength dispersive X-ray spectrometer, the characteristic X-ray intensity of metal corresponding to a thickness of 8 nm was detected.

In this inventive example, according to the first embodiment, plasma etching was carried out to the printed circuit board 10 in the following conditions. Note that the insulating layer 1 was etched by a thickness of 0.5 μm.

The frequency of the AC power supply was 40 kHz, the degree of vacuum was 33.3 Pa, the processing power was 1500 W, and the processing time was two minutes. The processing gas was a mixture gas including oxygen and tetrafluorocarbon in a flow rate ratio of 90:10.

After the etching process, the surface of the insulating layer 1 between the conductive patterns 3 was analyzed using the wavelength dispersive X-ray spectrometer, and the characteristic X-ray intensity of metal corresponding to a thickness of 0.1 nm was detected. It was confirmed that the residual metal 2a was sufficiently removed.

Then, a cover insulating layer of polyimide (not shown) was formed on the printed circuit board 10. When the printed circuit board 10 was kept in an environment at a temperature of 60° C. and with a humidity of 95% while a voltage of 30 V continued to be applied to the printed circuit board 10, the insulation resistance value between the conductive patterns 3 was $1 \times 10^{11} \Omega$ even after 500 hours, and there was no insulation failure. Note that the initial insulation resistance value was $1 \times 10^{12} \Omega$.

Inventive Example 2

In this inventive example, according to the second embodiment, plasma etching was carried out to the printed circuit board 10 in the following conditions. The inter-electrode distance between the AC electrode 5 and the earth electrode 6 was 1.5 mm. Note that the insulating layer 1 was etched by a thickness of 0.7 μm.

The frequency of the AC power supply was 100 kHz, the degree of vacuum was equal to atmospheric pressure, the processing power was 1100 W, and the processing time was 20 seconds. The processing gas was a mixture gas including helium, oxygen, and tetrafluorocarbon in a flow rate ratio of 98:1:1.

After the etching process, the surface of the insulating layer 1 between the conductive patterns 3 was analyzed using the wavelength dispersive X-ray spectrometer, and the characteristic X-ray intensity of metal corresponding to a thickness of 0.1 nm was detected. It was confirmed that the residual metal 2a was sufficiently removed.

Then, a cover insulating layer of polyimide (not shown) was formed on the printed circuit board 10. When the printed circuit board 10 was kept in an environment at a temperature of 60° C. and with a humidity of 95% while a voltage of 30 V continued to be applied to the printed circuit board 10, the insulation resistance value between the conductive patterns 3 was $1 \times 10^{11} \Omega$ even after 500 hours, and there was no insulation failure. Note that the initial insulation resistance value was $1 \times 10^{12} \Omega$.

Inventive Example 3

In this inventive example, according to the third embodiment, plasma etching was carried out to the printed circuit board 10 in the following conditions. The printed circuit board 10 was placed substantially in the center of a chamber 8 in a magnetron type plasma etching device. The insulating layer was etched by a thickness of 0.7 μm.

The frequency of the AC power supply was 2.45 GHz, the degree of vacuum was 80 Pa, the processing power was 600 W, and the processing time was one minute. The processing gas was a mixture gas including oxygen and tetrafluorocarbon in a flow rate ratio of 80:20.

After the etching process, the surface of the insulating layer 1 between the conductive patterns 3 was analyzed using the wavelength dispersive X-ray spectrometer, and the characteristic X-ray intensity of metal corresponding to a thickness of 0.3 nm was detected. It was confirmed that the residual metal 2a was sufficiently removed.

Then, a cover insulating layer of polyimide (not shown) was formed on the printed circuit board 10. When the printed circuit board 10 was kept in an environment at a temperature of 60° C. and with a humidity of 95% while a voltage of 30 V continued to be applied to the printed circuit board 10, the insulation resistance value between the conductive patterns 3 was $1\times10^{10}\Omega$ even after 500 hours, and there was no insulation failure. Note that the initial insulation resistance value was $1\times10^{12}\Omega$.

Comparative Example

In this comparative example, according to the first embodiment, plasma etching was carried out to the printed circuit board 10 in the following conditions.

In this comparative example, the printed circuit board 10 was placed in a sheath layer 7 and on the AC electrode 5.

The frequency of the AC power supply was 40 kHz, the degree of vacuum was 33.3 Pa, the processing power was 1500 W, and the processing time was two minutes. The processing gas was a mixture gas including oxygen and tetrafluorocarbon in a flow rate ratio of 90:10.

After the etching process, the surface of the insulating layer 1 between the conductive patterns 3 was analyzed using the wavelength dispersive X-ray spectrometer, and the characteristic X-ray intensity of metal corresponding to a thickness of 6 nm was detected. It was confirmed that the residual metal 2*a* was not removed.

Then, a cover insulating layer of polyimide (not shown) was formed on the printed circuit board 10. When the printed circuit board 10 was kept in an environment at a temperature of 60° C. and with a humidity of 95% while a voltage of 30 V continued to be applied to the printed circuit board 10, the insulation resistance value between the conductive patterns 3 was $1\times10^{7}\Omega$ after 107 hours, and an insulation failure occurred. Note that the initial insulation resistance value was $1\times10^{12}\Omega$.

EVALUATION

As can be seen from Inventive Examples 1 to 3, when the printed circuit board 10 is provided in a region outside the sheath layer 7 and processed by plasma etching, the residual metal 2*a* on the insulating layer 1 between the conductive patterns 3 is sufficiently removed.

Meanwhile, as can be seen from the comparative example, when the printed circuit board 10 is placed in a region in the sheath layer 7, and processed by plasma etching, the residual metal 2*a* on the insulating layer 1 between the conductive patterns 3 is not sufficiently removed. As can be understood from these results, when the printed circuit board 10 is processed by isotropic etching, the residual metal 2*a* can sufficiently be removed.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A method of manufacturing a printed circuit board, comprising the steps of:
    forming a thin metal film on an insulating layer;
    forming conductive patterns on said thin metal film by electroplating;
    removing said thin metal film excluding a region under said conductive patterns by etching; and
    processing the insulating layer exposed between said conductive patterns by isotropic plasma etching.

2. The method of manufacturing a printed circuit board according to claim 1, wherein said processing step comprises carrying out isotropic plasma etching to said insulating layer so that the etching depth of said insulating layer in the thickness-wise direction is in the range from 0.5 μm to 2 μm.

3. The method of manufacturing a printed circuit board according to claim 1, wherein said processing step comprises the step of providing said insulating layer outside a sheath layer in a plasma atmosphere.

4. The method of manufacturing a printed circuit board according to claim 1, wherein said step of forming a thin metal film on said insulating layer comprises the step of forming a thin metal film including a layer of copper on said insulating layer.

5. The method of manufacturing a printed circuit board according to claim 1, wherein said insulating layer comprises polyimide.

* * * * *